United States Patent [19]

Bocko et al.

[11] Patent Number: 4,604,118
[45] Date of Patent: Aug. 5, 1986

[54] METHOD FOR SYNTHESIZING MGO—AL$_2$O$_3$—SIO$_2$ GLASSES AND CERAMICS

[75] Inventors: Peter L. Bocko, Painted Post; William J. Wein, Corning; Charles E. Young, Watkins Glen, all of N.Y.

[73] Assignee: Corning Glass Works, Corning, N.Y.

[21] Appl. No.: 765,199

[22] Filed: Aug. 13, 1985

[51] Int. Cl.$^4$ ............................................. C03B 37/07
[52] U.S. Cl. ..................................... 65/3.12; 65/18.2; 427/163; 427/252; 427/253
[58] Field of Search ...................... 65/3.12, 18.2, 18.3; 427/163, 252, 253

[56] References Cited

U.S. PATENT DOCUMENTS

| | | | |
|---|---|---|---|
| 4,310,341 | 1/1982 | Barns et al. | 65/3.12 |
| 4,378,985 | 4/1983 | Powers | 65/3.12 |
| 4,406,680 | 9/1983 | Edahiro et al. | 65/3.12 |
| 4,501,602 | 2/1985 | Miller et al. | 65/18.3 |
| 4,537,864 | 8/1985 | Tick | 65/3.12 |
| 4,558,144 | 12/1985 | Fay et al. | 427/252 X |

*Primary Examiner*—Arthur Kellogg
*Attorney, Agent, or Firm*—K. van der Sterre

[57] ABSTRACT

A vapor phase method for the synthesis of MgO—Al$_2$O$_3$—SiO$_2$ products, including MgO—Al$_2$O$_3$—SiO$_2$ glasses of optical quality, wherein SiCl$_4$, aluminum halide, and organometallic magnesium vapors are oxidized by flame oxidation and the oxides collected and sintered to glass or ceramic products, is described. A added shield gas stream is provided during flame oxidation of the vapors to reduce or prevent MgCl$_2$ by-product formation at the burner and in the product.

8 Claims, 5 Drawing Figures

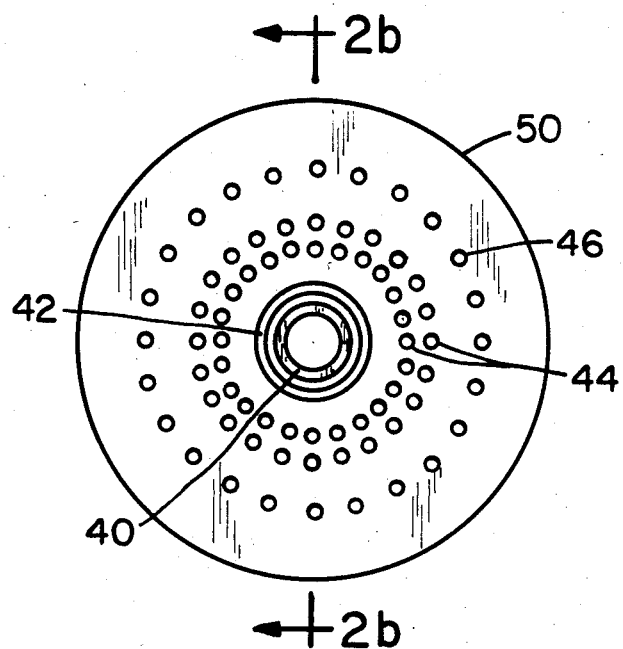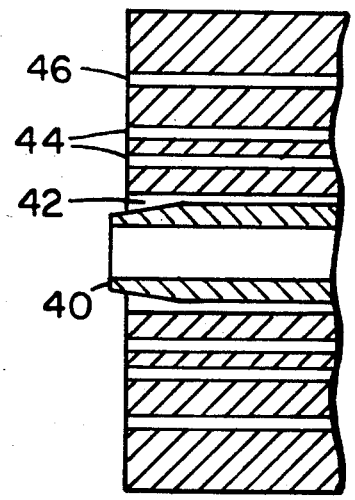
Fig. 2a    Fig. 2b
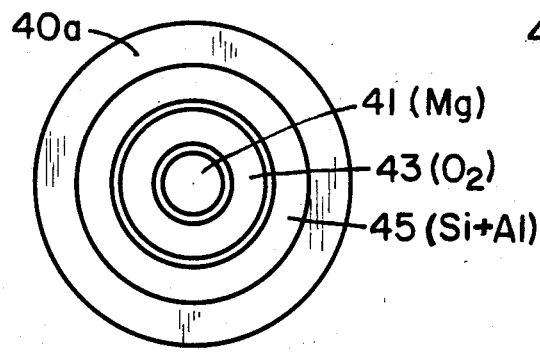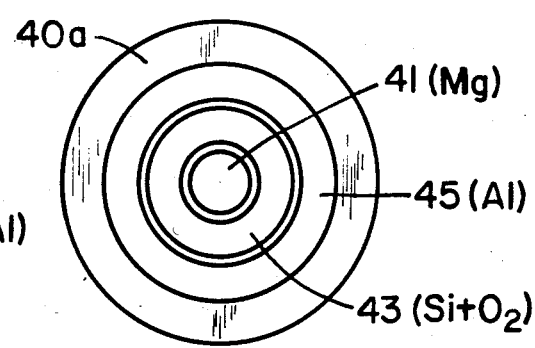
Fig. 3a    Fig. 3b

METHOD FOR SYNTHESIZING MgO—Al$_2$O$_3$—SiO$_2$ GLASSES AND CERAMICS

The present invention is in the field of glass and ceramic synthesis and particularly relates to an improved method for the vapor-phase synthesis of magnesium aluminosilicate (MgO—Al$_2$O$_3$—SiO$_2$) compositions for glass or ceramic products.

Magnesium aluminosilicate glasses are relatively stable glasses exhibiting good optical quality and desirable electrical and elastic properties, with present or prospective uses including high strength fiber reinforcement and optical fibers for telecommunications or other specialized optical applications. Magnesium aluminosilicate glass-ceramics are presently utilized for radome fabrication, while low-expansion cordierite honeycomb catalyst supports constitute a major application for crystalline MgO—Al$_2$O$_3$—SiO$_2$ ceramics.

Specialty applications for MgO—Al$_2$O$_3$—SiO$_2$ glasses and ceramics can require close control over composition and the exclusion from the composition of impurities deleterious for the application involved. For example, optical fiber applications generally require the almost complete exclusion of light-absorbing metallic impurities such as Fe, Cr, and Mn from the composition in order to attain a usefully transparent glass. It has been recognized that the necessary levels of purity for such applications are best achieved by vapor deposition processes wherein the glass is synthesized from carefully distilled volatile chlorides of the glass-forming compounds. Thus pure source compounds such as SiCl$_4$, TiCl$_4$, GeCl$_4$ and POCl$_3$ are presently used to prepare the highly transparent glasses used for making optical fibers. One particularly useful synthesis involves the flame oxidation of vapors of these chlorides, as taught in U.S. Pat. No. 2,272,342 and 2,326,059, followed by consolidation of the flame oxidation product to clear glass.

Methods for synthesizing glasses containing the oxides of metallic elements which do not form volatile chlorides have long been of interest. U.S. Pat. No. 3,801,294 describes a method and apparatus for generating vapors of solid chlorides for glass synthesis, including vapors of AlCl$_3$, ZrCl$_4$ and TaCl$_5$. In U.S. Pat. No. 4,501,602, the use for glass synthesis of certain volatile yet stable organometallic compounds of aluminum, magnesium and other metallic elements is described. In that patent, both δ-Al$_2$O$_3$ and MgO—SiO$_2$ glasses are synthesized by the flame oxidation of volatile beta-diketonate complexes of aluminum and magnesium, with SiO$_2$ being derived conventionally from SiCl$_4$ oxidation.

In conventional practice, volatile metal source compounds for the synthesis of glasses are oxidized by supplying them as vapors through a central orifice in a gas-oxygen burner. Where the vapors are compatible and do not interact at their delivery temperatures, they are typically mixed at the burner to form a homogeneous vapor mixture prior to injection into the flame via the central orifice or fume tube. Where they do interact, it has been proposed to use concentric fume tubes for delivering the reactants separately into the burner flame. However, such interactions have not been a significant problem in commercially-prepared vapor-deposited glasses since, at present, all are doped silica glasses made with SiCl$_4$ and compatible amounts of one or more of TiCl$_4$, GeCl$_4$, POCl$_3$, BCl$_3$ and fluorine.

Neither magnesium nor aluminum have been used to any degree in commercial vapor-deposited glasses, the development of suitable source compounds for these metals being relatively recent and the cost of such source compounds being quite high.

SUMMARY OF THE INVENTION

The present invention provides a practical method for the synthesis of MgO—Al$_2$O$_3$—SiO$_2$ glasses by a vapor deposition method. The method reduces the need for large amounts of expensive organometallic source materials by employing commercially pure AlCl$_3$ or AlBr$_3$ instead of organometallic aluminum as an aluminum source material. Through the use of a suitable high-temperature aluminum halide vapor generating system and a novel flame oxidation procedure, good yields of an MgO—Al$_2$O$_3$—SiO$_2$ oxide product suitable for sintering to optically clear MgO—Al$_2$O$_3$—SiO$_2$ glass or to crystalline MgO—Al$_2$O$_3$—SiO$_2$ ceramics may be obtained.

To prepare the oxide product, conventionally synthesized in the form of a fine particulate or soot, vapors of SiCl$_4$, an aluminum halide (AlCl$_3$ or AlBr$_3$), and an organometallic magnesium compound are first generated and supplied to a flame oxidation burner. The aluminum halide and organometallic magnesium vapors are generated and supplied in separate vapor streams in order to control their subsequent processing in the flame oxidation step.

The silicon, aluminum and magnesium vapors thus provided are next expelled from the face of a flame oxidation burner and into an oxidizing flame fed by the burner. To avoid buildup on the burner face, however, the aluminum halide and organometallic magnesium vapors are expelled in separate vapor streams and a third vapor stream, referred to as a fume shield, is expelled from the burner face between the aluminum and magnesium streams. This interposing fume shield stream is substantially free of both aluminum halide and organometallic magnesium vapors, although it may contain SiCl$_4$ vapors if desired.

The product of the flame oxidation of the vapors so expelled, a particulate MgO—Al$_2$O$_3$—SiO$_2$ oxide product or soot, is then collected for further processing. This soot can be directly captured on a suitable support and sintered to a glass or ceramic product, or it can be captured in loose form and subsequently shaped and sintered to the product. Because it is formed by vapor deposition, the product will generally be free of impurities such as Fe, Mn, Cr and other metallic elements which can introduce unwanted optical absorption or other undesirable properties into glasses and ceramics.

DESCRIPTION OF THE DRAWING

The invention may be further understood by reference to the drawing, wherein:

FIGS. 2a and 2b are schematic illustrations of a conventional flame oxidation burner; and FIGS. 3a and 3b are schematic cross-sectional views of fume tube geometries suitable for incorporation into a flame oxidation burner for practicing the present invention.

DETAILED DESCRIPTION

Figure 1:
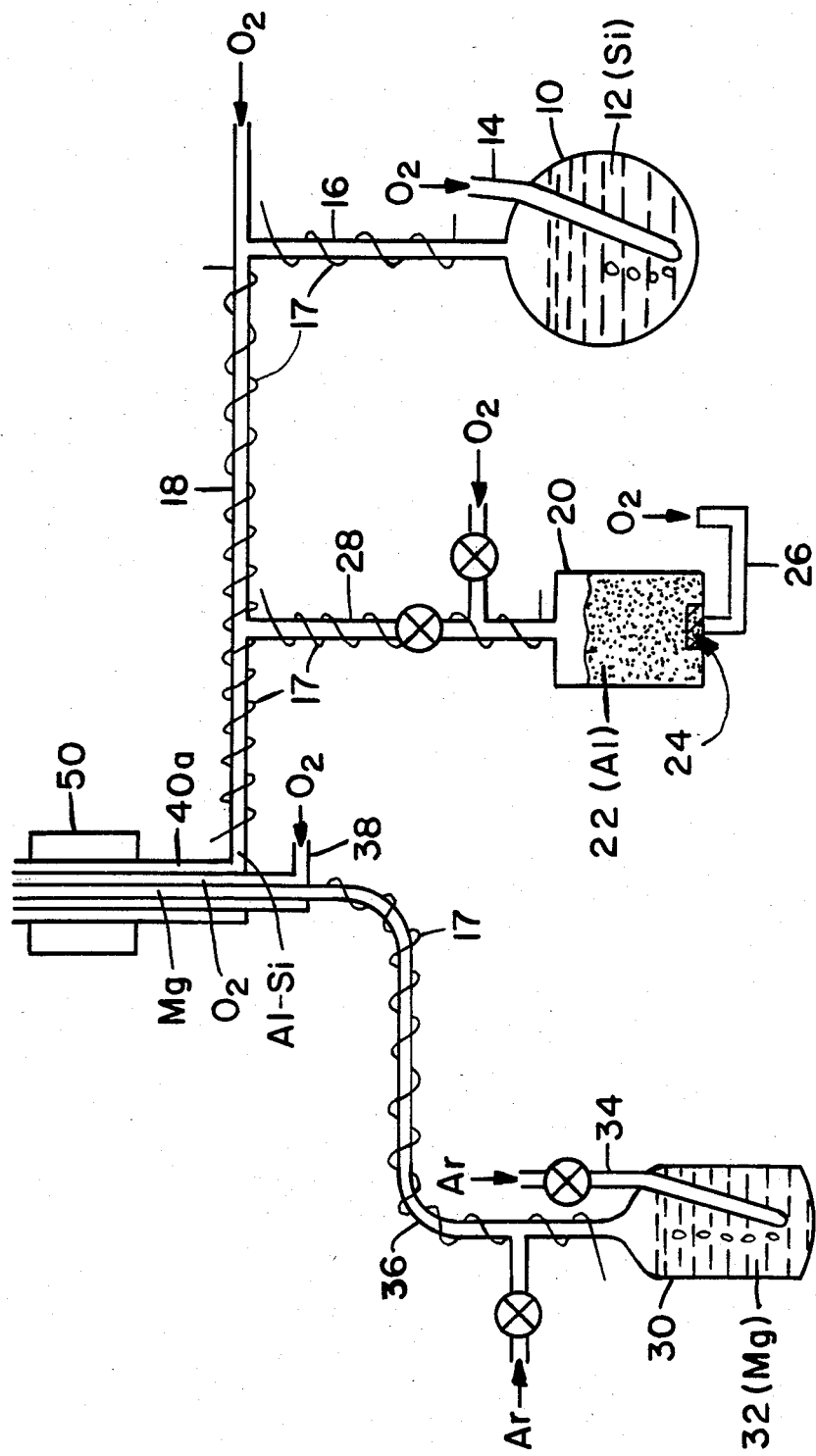
FIG. 1 is a schematic illustration of vapor generating and delivery apparatus useful for synthesizing MgO—Al$_2$O$_3$—SiO$_2$ products according to the invention.

The preferred aluminum source material for the vapor phase synthesis of MgO—Al$_2$O$_3$—SiO$_2$ glasses according to the invention is aluminum chloride. This material is less expensive than presently available organometallic aluminum source materials, has been well characterized, and is commercially available in high purity. However, since it does not melt at atmospheric pressure, vapor generation is somewhat more complex than with conventional liquid chlorides such as SiCl$_4$.

The generation of AlCl$_3$ vapors can be conveniently achieved from solid AlCl$_3$ at temperatures of 160°–180° C., at which temperatures the vapor pressure of AlCl$_3$ is in excess of 100 mm (Hg). A suitable vapor generator consists of a heavy-walled stainless steel vessel incorporating a flat bottom, the bottom being lined with a fritted glass disk on which a charge of powdered AlCl$_3$ is placed. A suitable carrier gas such as oxygen is then introduced into the bottom of the vessel through the fritted disk and caused to diffuse upwardly through the AlCl$_3$, picking up AlCl$_3$ vapors and exiting the stainless steel vessel through a top exhaust port into a heated vapor delivery line to the burner. An AlCl$_3$ vapor generator of this design provides adequate thermal contact with the AlCl$_3$ source material and reasonable control of vapor saturation levels in the oxygen carrier gas up to the point when the AlCl$_3$ charge becomes largely depleted.

Alternative aluminum source materials include other vaporizable aluminum compounds such as liquid AlBr$_3$, AlBrCl$_2$, and a eutectic mixture of AlCl$_3$:NaCl, the eutectic melting at about 110° C. to yield AlCl$_3$ vapors at a partial pressure on the order of 1–10 mm (Hg). The latter two sources, however, undergo composition changes during vapor generator operation, making partial pressure control difficult, while AlBr$_3$ generates toxic bromine and also tends to clog conventional liquid vapor delivery systems. Thus the use of these alternative aluminum vapor sources is not preferred.

SiCl$_4$ vapor delivery is preferably accomplished utilizing a conventional SiCl$_4$ bubbler system. Liquid SiCl$_4$ in a glass bubbler is heated to a suitable temperature for vaporization, e.g. 40° C., and a carrier gas such as oxygen is bubbled through the heated SiCl$_4$ where it is saturated with chloride vapors. The SiCl$_4$-saturated carrier gas is then transported to the oxidation burner via a heated delivery line.

The preferred magnesium vapor source for use according to the invention is Mg(hfa)$_2$.1,2-DME (magnesium hexafluoroacetylacetonate with a 1,2-dimethoxyethane adduct). This compound melts at about 70° C., and exhibits good thermal stability and volatility at vaporization temperatures up to about 200° C. It can be efficiently vaporized at 170° C., at which temperature the complex has a vapor pressure on the order of 50 mm (Hg).

Mg(hfa)$_2$.1,2-DME can be conveniently synthesized by reacting distilled hexafluoroacetylacetone (hfa) with basic magnesium carbonate ((MgCO$_3$)$_4$.Mg(OH)$_2$.5-H$_2$O), adding the former dropwise to an ethyl ether solution of the latter, followed by refluxing. The resulting hydrate (Mg(hfa)$_2$.2H$_2$O) can then be converted to the DME adduct by refluxing an excess 1,2-dimethoxyethane. For a further discussion of this compound and its synthesis, reference may be made to copending U.S. patent application Ser. No. 06/622,829, filed Oct. 19, 1984, now U.S. Pat. No. 4,558,144 and commonly assigned herewith.

Other organometallic magnesium compounds could be used in place of Mg(hfa)$_2$.1,2-DME, if desired. Magnesium hexafluoroacetylacetonate forms other volatile adducts with Lewis bases, including for example Mg(hfa)$_2$.2THF (the tetrahydrofuran adduct of Mg(hfa)$_2$) as described in U.S. Pat. Nos. 4,500,722 and 4,501,602. The latter patent also describes other beta-diketonates of magnesium which could be used. Finally, other organometallic magnesium compounds such as dimethyl magnesium, although pyrophoric, could be used.

A suitable vaporization system for the generation of magnesium vapors from Mg(hfa)$_2$.1,2-DME may comprise a glass bubbler vessel, heatable by means of an oil bath heater, mantle or the like, into which the magnesium compound is charged. The vessel is heated above the melting temperature of the compound and a carrier gas supply tube extending below the surface of the melt injects a carrier gas such as argon into the molten compound. The vapor-saturated carrier gas is then fed out of a top port in the bubbler and into a heated delivery line to the flame oxidation burner.

A major problem to be overcome in the synthesis of MgO—Al$_2$O—SiO$_2$ glasses by vapor deposition is that of burner buildup at the face of the flame oxidation burner, which buildup eventually causes burner clogging and/or large inclusions in the glass resulting from deposited fragments of the accumulated material. We have discovered that this problem is due to a premature reaction occurring between the organometallic magnesium source and the heated AlCl$_3$ vapor stream at the burner face, resulting in MgCl$_2$ formation on the burner.

A conventional flame oxidation burner such as has been adapted to the synthesis of multicomponent glasses in the prior art is illustrated in FIGS. 2a and 2b of the drawing. In that illustration, burner 50 comprises a fume tube 40 through which vapors of source compounds such as SiCl$_4$, TiO$_2$ and the like are injected into the burner flame. The burner further comprises combustion gas jets 44 through which a combustible premix of gas and oxygen is emitted. Disposed between fume tube 40 and gas/oxygen jets 44 is inner shield outlet 42 which shields the fumes from the effects of the flame until the fumes have traveled a distance away from the burner face. Outer shield jets 46 provide for gas flow exteriorly of the flame and can be used to control temperature in the region of the flame.

The problem of burner buildup in the case of conventional burners to synthesize MgO—Al$_2$O$_3$—SiO$_2$ cannot be solved simply by delivering the magnesium and aluminum vapors to the burner in separate vapor streams, as has been proposed for other incompatible source compounds. Nor can buildup be avoided by controlling the flow of vapors to the burner so that the actual oxidation of reactants occurs at a position more distant from fume delivery outlets at the burner. To the contrary, we have observed clogging during MgO—Al$_2$O$_3$—SiO$_2$ synthesis even in burners with separate concentric fume tubes for the Mg and Al source materials, and at very high inner shield gas flow rates. rates.

In order to avoid this buildup and to form a good quality oxide deposit, we have found it necessary to interpose a shield gas stream between the streams containing the AlCl$_3$ and organometallic magnesium vapors. Without being bound by any particular theory of operation for the invention, it is presently believed that this shield gas stream, referred to as a fume shield, retards the interaction between the aluminum chloride and organometallic magnesium vapors such that oxidation of these vapors can proceed before they can interact to form the undesired chloride.

The composition of the fume shield gas stream does not appear to be critical provided that it is free of both $AlCl_3$ and organometallic magnesium. Other volatile chlorides can be present; in fact $SiCl_4$ can comprise a major component of the fume shield if desired, without any significant formation of magnesium chloride on the burner.

FIGS. 3a and 3b of the drawing schematically illustrate orifice geometry for modified fume tube 40a, which could be substituted for the fume tube 40 in FIGS. 2a and 2b of the drawing, and which provides for a fume shield gas flow suitable for the generation of $MgO—Al_2O_3—SiO_2$ oxide soots according to the invention. In FIG. 3a, showing a particularly preferred fume delivery plan for a fume tube 40a, an organometallic magnesium compound such as $Mg(hfa)_2.1,2-DME$ is delivered through the central fume tube channel 41, an $AlCl_3—SiCl_4$ mixture is delivered through the outer fume tube channel 45, and an inert shield gas such as oxygen is delivered through the fume shield channel 43 between the central and outer fume tubes. The use of an oxygen gas fume shield to separate an outer $SiCl_4—AlCl_3$ vapor stream from an inner magnesium organometallic vapor stream constitutes the best mode presently known for carrying out the method of the invention.

In FIG. 3b, the organometallic magnesium compound from fume tube 40a is again delivered through the central tube channel 41, but $AlCl_3$ alone with a carrier gas is delivered through the outer fume tube channel 45, while $SiCl_4$ plus a carrier gas is delivered through the fume shield channel 43, the latter mixture constituting the interposing shield between the $AlCl_3$ and the organometallic magnesium-containing vapor streams.

A suitable system for generating $MgO—Al_2O_3—SiO_2$ soot is illustrated in FIG. 1 of the drawing. The system comprises $SiCl_4$ vapor generator 10, $AlCl_3$ vapor generator 20, and organometallic magnesium vapor generator 30, each supplying a vapor stream to fume tube 40a and burner 50.

$SiCl_4$ vapor generator 10 comprises a glass flask containing liquid $SiCl_4$, into which carrier gas delivery tube 14 injects an oxygen carrier gas from an oxygen source. The glass flask is heatable by a heating mantel, oil bath or the like, not shown, to raise the vapor pressure of the liquid $SiCl_4$ to a suitable level. Oxygen saturated with $SiCl_4$ vapors exits the flask into delivery line 16, which is preferably heated, e.g., with electrical heating tape 17, to prevent vapor condensation in the delivery line. Delivery line 16 feeds into main chloride delivery line 18 which is also heated, preferably to a temperature higher than the temperature of line 16.

Aluminum chloride vapor generator 20 consists of a stainless steel vessel containing a charge of pure aluminum chloride 22. On the bottom surface of the vessel is situated a coarse-fritted glass disk 24 operating to diffuse the flow of oxygen carrier gas into the vessel from carrier gas line 26. The oxygen diffuses upwardly through the charge of $AlCl_3$ 22, that charge and the entire generator 20 being heatable by a heating mantel to a temperature of at least about 150° C. to increase the vapor pressure of the $AlCl_3$ therein. Oxygen saturated with $AlCl_3$ vapors then exits vessel 20 into heated delivery line 28 and from there into main chloride delivery line 18 to fume tube 40a. Preferably, delivery line 28 is maintained at a temperature above $AlCl_3$ vapor generator 20 by heating tape 17, and main chloride delivery line 18 is maintained at a temperature above $AlCl_3$ delivery line 28, at least from line 28 to fume tube 40a, to minimize the possibility of $AlCl_3$ condensation in the lines.

Organometallic magnesium vapor generator or bubbler 30 consists of a glass vessel containing a charge 32 of an organometallic magnesium compound such as $Mg(hfa)_2.1,2-DME$. The glass vessel is heatable by a silicone oil bath, not shown, to a temperature sufficient to increase the vapor pressure of the magnesium compound to a suitable level, typically at least about 150° C. for a compound such as preferred.

Carrier gas inlet tube 32 injects a flow of an argon carrier gas into the magnesium compound, which is maintained above its melting point, and argon saturated with magnesium vapors exits the vessel into heated delivery line 36. Preferably, delivery line 36 is heated to a temperature above vessel 30 by heating tape 17 to insure that condensation in the delivery line does not occur.

At the base of burner 50, the vapor delivery lines 18 and 36 are combined with an oxygen shield gas line 38 to form three-channeled fume tube 40a leading into burner 50 and terminating at the face thereof. Magnesium vapors are channeled through the central channel of the fume tube and $SiCl_4+AlCl_3$ vapors through the outermost channel, while oxygen is fed through the channel between the central and outermost tubes. The burner is also supplied with conventional inner and outer shield gas and fuel gas/oxygen ports (not shown), disposed exteriorly of the fume tube 40a (as generally exteriorly of fume tube 40 as illustrated in FIG. 2a), which ports support a gas-oxygen flame on the burner face into which the vapors from the fume tube are injected.

In designing a vapor delivery system for the manufacture of $MgO—Al_2O_3—SiO_2$ oxide products, particular attention must be given to avoiding vapor condensation in the system, since all vapors used will readily condense and some will solidify at ambient temperatures. In practice, any condensation of vapors along the vapor delivery path, once initiated, will rapidly accelerate and complete blockage will rapidly occur.

As is known from U.S. Pat. No. 3,801,294, the vapor delivery lines in systems designed for high-temperature vapor delivery should be heatable and thermally conductive; stainless steel is a suitable material for the fabrication of such lines. In addition, however, the system should be designed so that both the temperature and the space velocity of each vapor being delivered to the oxidation burner are higher at the burner than at the vapor generator. Most preferably, there will be a gradual or stepwise increase in the temperature and space velocity of each of the vapor streams from the point at which the vapors are generated until they arrive at the burners. This is best achieved by eliminating dead spaces in the delivery system, by avoiding sharp bends in the delivery lines, by reducing the cross-sectional dimensions of the delivery lines as they approach the burner, and by increasing the temperature of the vapors as they approach the burner.

The invention may be further understood by reference to the following example describing the synthesis of oxide products and glasses in accordance therewith.

EXAMPLE I (MgO—Al$_2$O$_3$—SiO$_2$ glass)

A three-liter round-bottomed flask provided with an electric heating mantel is charged with SiCl$_4$. The flask is connected by means of a heated stainless steel delivery line to a flame oxidation burner and is provided with an oxygen gas inlet tube for bubbling oxygen through the SiCl$_4$.

A second glass flask is charged with 1 kg of Mg(hfa)$_2$.1,2-DME, the flask being immersed in a silicone oil heating bath and also being connected to the flame oxidation burner by a heated stainless steel delivery line. The flask is provided with a glass bubbler tube immersed in the magnesium compound and connected to an argon source for injecting argon carrier gas into the compound. The immersed section of the bubbler tube is provided with multiple perforations for argon outlet.

A heavy-walled stainless steel vessel with a flat top and bottom is charged with 500 grams of pure anhydrous aluminum chloride, commercially available as ACL-0099 aluminum chloride from the Pearsall Chemical Division of the Whitco Chemical Corp., Houston, Tex. The vessel comprises a bottom port for the introduction of an oxygen carrier gas, the port being covered by a coarse-fritted glass disk to disperse the carrier gas flow entering the vessel. The vessel is electrically heated by a heating mantel, and is connected by a heated stainless steel delivery line to the aforementioned flame oxidation burner.

Each of the stainless steel delivery lines from the above vessels is wrapped with fiberglass-insulated electrical heating tape. The lines from the SiCl$_4$ and AlCl$_3$ vessels are joined before reaching the burner to form a halide delivery line, and the halide delivery line is also wrapped with heating tape. Each delivery line is maintained at a temperature at least 20° C. above the temperature of the bubbler or vapor generator to which it is connected.

The flame oxidation burner to which the stainless steel delivery lines are connected is a small laboratory burner having the same general oriface arrangement as shown in FIG. 2a and including, in addition to inlets for the fume tube, inlets for fuel gas, combustion oxygen and inner and outer shield gas oxygen. The burner is of dimensions such that the outer shield oriface ring (46) has a diameter of 18 mm. In connecting the stainless steel vapor delivery lines to the fume tube, the halide delivery line is connected to the outermost fume tube channel and the magnesium vapor line is connected to the central fume tube channel, as generally illustrated in FIGS. 1 and 3a of the drawings. The intermediate fume tube channel or fume shield is connected to an oxygen source.

The flame oxidation burner is ignited for preheating, the fuel gas consisting of a mixture of a methane natural gas at a flow rate of 4.6 standard liters per minute (slm) and combustion oxygen at a flow rate of 6.0 slm. Inner shield oxygen flow is set at 2.2 slm; no outer shield flow is used. The SiCl$_4$ bubbler is next heated to 40° C., the AlCl$_3$ vapor generator to 175° C., and the Mg(hfa)$_2$.1,2-DME bubbler to 170° C.

Carrier gas flow to each of the bubblers and AlCl$_3$ generator is commenced, oxygen being supplied to the SiCl$_4$ bubbler and AlCl$_3$ vapor generator and argon to the magnesium-containing bubbler. In each case, the carrier gas is preheated to the temperature of the bubbler or vapor generator prior to injection into the source compound. The flow of oxygen to the SiCl$_4$ bubbler is set at 1 slm, the flow of oxygen to the AlCl$_3$ vapor generator at 0.050 slm, and the flow of argon to the Mg(hfa)$_2$.1,2-DME bubbler at 0.250 slm. Oxygen flow for the fume tube shield is set at 0.28 slm. With the commencement of vapor flows to the flame oxidation burner, MgO—Al$_2$O$_3$—SiO$_2$ soot is formed in and ejected from the flame.

The MgO—Al$_2$O$_3$—SiO$_2$ soot thus generated is collected on a rotating alumina mandrel to provide a porous soot preform of approximately 200 grams weight. This soot preform is then consolidated to clear glass in an electric furnace operating at 1450° C. The resulting clear glass is then drawn into glass rod for analysis.

The glass rod has an analyzed composition of approximately 0.37% MgO, 1.39% Al$_2$O$_3$ and the remainder SiO$_2$, plus a fraction of a percent (0.02%) of fluorine, the latter being introduced into the glass as a byproduct of the combustion of the fluorine-containing magnesium source compound. The MgO—Al$_2$O$_3$—SiO$_2$ glass has a thermal expansion coefficient of $7.4 \times 10^{-7}$/°C., a density of 2.211 g/cm$^3$, a strain point of approximately 966° C., an annealing point of approximately 1067° C., and a refractive index ($n_D$) of about 1.4594.

The glass rod produced as described is of a purity and optical quality suitable for optical fiber fabrication. It can be formed into optical fiber by drawing and then coating with a low-refractive index plastic cladding such as silicone polymer, or by first applying a glass cladding layer of fluorine doped silica over the MgO—Al$_2$O$_3$—SiO$_2$ glass rod and then drawing the composite glass preform into fiber. In either case, optical fibers exhibiting optical attenuations of less than 15 db/km are obtained.

EXAMPLES 2–10

Utilizing the vapor delivery and flame oxidation apparatus described in Example I, a series of nine additional MgO—Al$_2$O$_3$—SiO$_2$ compositions are synthesized. Tables I and IA below report the results of these syntheses. Table I-Reactant Flows sets forth flow rates for each of the carrier gases employed, in slm, those flows dictating generally the relative concentrations of the Mg, Al, and Si-containing reactants present in the vapor stream of the burner. Table IA-Composition reports, for the nine resulting products, the analyzed compositions for the particulate oxide soots collected under the carrier flow rates reported in Table I, in parts by weight. In most cases the soots were thereafter sintered to glass, and Table IA also reports index of refraction valves $n_D$ where recorded for the individual glass samples.

For syntheses 2–4 of the Tables, vapor temperatures and burner fuel and shield gas flows were substantially the same as used in Example I, while for syntheses 5–10, the gas flows were targeted approximately as follows: natural gas, 3.9 slm; combustion oxygen, 4.2 slm; inner shield oxygen, 2.4 slm; fume shield oxygen, 0.28 slm; and outer shield oxygen, 3.7 slm. However, soot composition is not strongly affected by these burner flow parameters. Rather, the most significant factors causing composition shifts away from target values, such as shown in Table IA, are the levels of reactants in the vapor generators, and the particle size of the AlCl₃ used to generate the aluminum vapors.

TABLE I

| Synthesis No. | Reactant Flows | | |
|---|---|---|---|
| | Mg (Ar) | Al (O₂) | Si (O₂) |
| 2 | 1.0 | 0.02 | 1.0 |
| 3 | 1.0 | 0.05 | 1.0 |
| 4 | 4.0 | 0.02 | 1.0 |
| 5 | 1.0 | 0.05 | 1.0 |
| 6 | 1.0 | 0.04 | 1.0 |
| 7 | 1.0 | 0.08 | 1.0 |
| 8 | 1.0 | 0.12 | 1.0 |
| 9 | 1.0 | 0.10 | 1.0 |
| 10 | 1.0 | 0.08 | 0.75 |

TABLE IA

| Product No. | Compositions | | | | |
|---|---|---|---|---|---|
| | MgO | Al₂O₃ | SiO₂ | F | $N_D$ |
| 2 | 2.66 | 10.9 | 85.8 | 0.62 | — |
| 3 | 2.05 | 17.4 | 79.8 | 0.71 | — |
| 4 | 7.39 | 11.7 | 77.7 | 3.18 | — |
| 5 | 2.08 | 3.23 | 93.8 | 0.88 | 1.464 |
| 6 | 2.81 | 2.72 | 94.2 | 0.28 | 1.4699 |
| 7 | 2.41 | 5.64 | 91.7 | 0.26 | 1.4696 |
| 8 | 3.33 | 11.4 | 85.1 | 0.20 | 1.4806 |
| 9 | 3.88 | 7.44 | 88.4 | 0.26 | 1.4764 |
| 10 | 3.77 | 10.0 | 86.0 | 0.21 | 1.4787 |

Table IA indicates that a relatively broad range of MgO—Al₂O₃—SiO₂ composition is attainable in the MgO—Al₂O₃—SiO₂ glass-forming region in accordance with the invention, and it is expected that still other MgO—Al₂O₃—SiO₂ compositions could readily be synthesized for ceramic applications where consolidation to a vitreous product is not required. Thus the foregoing examples are merely illustrative of oxide compositions and synthesizing procedures which may be practiced within the scope of the appended claims.

We claim:

1. A method for synthesizing a vapor deposited MgO—Al₂O₃—SiO₂ oxide product which comprises the steps of:
   (a) generating and supplying to a flame oxidation burner vapors of each of SiCl₄, an aluminum halide, and a magnesium organometallic compound, the aluminum halide vapors and magnesium organometallic vapors being supplied in separate vapor streams;
   (b) injecting the vapors into an oxidizing combustion flame supported by the burner, the aluminum halide and organometallic magnesium vapors being expelled from the burners into the flame in separate vapor streams, and an interposing shield gas stream, free of both aluminum halide and magnesium organometallic vapors, being expelled into the flame between the streams containing the aluminum halide and magnesium organometallic vapors; and
   (c) collecting the MgO—Al₂O₃—SiO₂ particulate oxidation product resulting from combustion of the vapors by the flame.

2. A method in accordance with claim 1 wherein the aluminum halide vapors consist essentially of AlCl₃.

3. A method in accordance with claim 2 wherein the interposing shield gas stream comprises SiCl₄ vapors.

4. A method in accordance with claim 2 wherein the interposing shield gas stream consists essentially of oxygen.

5. A method for synthesizing a vapor-deposited MgO—Al₂O₃—SiO₂ glass which comprises the steps of:
   (a) generating and supplying to a flame oxidation burner vapors of each of SiCl₄, an aluminum halide, and a magnesium organometallic compound, the aluminum halide vapors and magnesium organometallic vapors being supplied in separate vapor streams;
   (b) injecting the vapors into an oxidizing combustion flame supported by the burner, the aluminum halide and organometallic magnesium vapors being expelled from the burners into the flame in separate vapor streams, and an interposing shield gas stream, free of both aluminum halide and magnesium organometallic vapors, being expelled into the flame between the streams containing the aluminum halide and magnesium organometallic vapors; and
   (c) collecting the MgO—Al₂O₃—SiO₂ particulate oxidation product resulting from combustion of the vapors by the flame; and
   (d) heating the collected particulate MgO—Al₂O₃—SiO₂ oxidation product to sinter it to a clear glass.

6. A method in accordance with claim 5 wherein the aluminum halide consists essentially of AlCl₃.

7. A method in accordance with claim 6 wherein the interposing shield gas stream comprises SiCl₄ vapors.

8. A method in accordance with claim 6 wherein the interposing shield gas stream consists essentially of oxygen.

* * * * *